US006947344B2

(12) United States Patent
Suh (10) Patent No.: US 6,947,344 B2
(45) Date of Patent: Sep. 20, 2005

(54) MEMORY DEVICE AND METHOD OF READING DATA FROM A MEMORY CELL (75) Inventor: Jungwon Suh, Surham, NC (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/376,408

(22) Filed: Feb. 28, 2003

(65) Prior Publication Data

US 2004/0170075 A1 Sep. 2, 2004

(51) Int. Cl.$^7$ ................................................ G11C 7/00
(52) U.S. Cl. ........................ 365/205; 365/203; 365/207
(58) Field of Search ................................. 365/230, 205, 365/207, 189.01, 189.06, 189.07, 210, 203

(56) References Cited

U.S. PATENT DOCUMENTS

| 4,716,550 | A | * | 12/1987 | Flannagan et al. ........... 365/207 |
| 5,134,588 | A | * | 7/1992 | Kubota et al. ............... 365/207 |
| 5,392,249 | A | * | 2/1995 | Kan ............................ 365/203 |
| 5,566,116 | A | * | 10/1996 | Kang .......................... 365/205 |
| 5,648,927 | A | * | 7/1997 | Tran ............................. 365/63 |
| 5,724,294 | A | * | 3/1998 | Khieu ......................... 365/210 |
| 5,745,423 | A | * | 4/1998 | Tai ............................. 365/203 |
| RE36,655 | E | * | 4/2000 | Kozaru et al. ........... 365/189.05 |
| 6,307,768 | B1 | * | 10/2001 | Zimmermann ............... 365/51 |
| 6,717,866 | B2 | * | 4/2004 | Marr ....................... 365/189.09 |

OTHER PUBLICATIONS

H. Hidaka et al, "Twisted Bit–Line Architectures for Multi–Megabit DRAM's", IEEE Journal of Solid–State Circuits, vol. 24, No. 1, Feb. 1989.

* cited by examiner

Primary Examiner—Gene N. Auduong
(74) Attorney, Agent, or Firm—Brinks Hofer Gilson & Lione (57) ABSTRACT

The present invention relates to a memory cell having a quasi-folded bit line sensing arrangement with an open bit line cell array. The memory cell array noise is negligible compared to the conventional open bit line. Also, the twisted bit line structure can be applied for the invention to reduce the inter-bit line coupling noise. The embodiments of the present invention reduce the size of the edge array, reduce the sensing power requirements, and provide a simple bit line layout. According to one embodiment of the present invention, a memory device comprises a plurality of sense amplifiers, each sense amplifier enabling access to data associated with arrays of cells; a bit line pair being coupled to each sense amplifier and comprising a bit line and a complementary bit line; a plurality of word lines associated with an array of cells; and a plurality of switches is employed to enable access to memory cells of the memory device. The arrangement of the memory device enables a VBLEQ signal to be coupled directly to the bit lines and complementary bit lines of the memory device. An improved sense amplifier having precharge circuit of a single transistor is also described. According to another aspect of the present invention, a method of reading and writing data in a memory device is described. The method comprises providing a bit line pair having a bit line and a complementary bit line, and coupling the bit line pair to a plurality of sense amplifiers. A plurality of switches is also provided in the bit line pair. The plurality of switches enables access to a memory cell to enable reading and writing data in the memory cell.

24 Claims, 12 Drawing Sheets

MEMORY DEVICE AND METHOD OF READING DATA FROM A MEMORY CELL

FIELD OF THE INVENTION

The present invention relates generally to memory cells, and in particular, to Dynamic Random Access Memory having open bit line cell arrays and method of bit line configuration to read data from a memory cell.

BACKGROUND OF THE INVENTION

In a memory device, cell area is the most significant factor which determines the chip size. Reducing memory cell size has a major impact on cost effectiveness and compatibility to packages of previous generations. One important consideration in reducing the size of a memory cell is the configuration of the bit and complementary bit lines. The arrangement of the bit and complementary bit lines impacts the noise and inter-bit line coupling.

Figure 1:
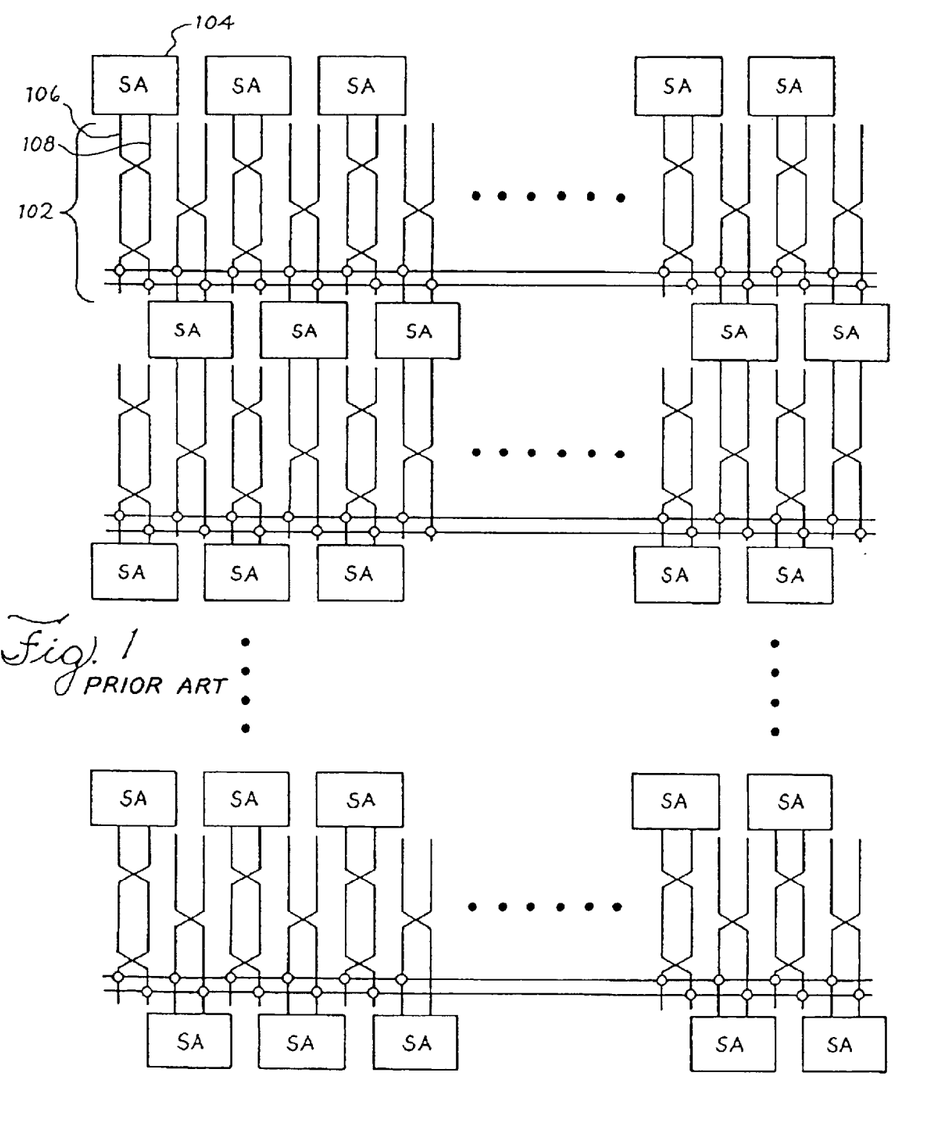
FIG. 1 is a circuit diagram of a portion of a conventional memory cell having a twisted folded bit line configuration.

There are two conventional arrangements of bit and complementary bit lines. The twisted folded bit line configuration, as shown for example in FIG. 1, has been used in most dynamic random access memory (DRAM) cells because of its noise immunity. In particular, a sense amplifier 104 is coupled to a bit line 106 and a complementary bit line 108 in memory cell array 102. As is shown, the bit lines are twisted, providing reduced inter-bit line coupling. With the recent improvements in semiconductor manufacturing, this configuration has achieved a minimum cell size of $8F^2$, where F is a minimum feature size.

If the smaller cell size is required to reduce total chip size, an open bit line configuration is often employed. The open bit line configuration has a $6F^2$ (or $4F^2$) cell area and provides simple structure. However, the open bit line configuration suffers from noise due to the different location of the bit lines. That is, because the bit line and the complementary bit lines are associated with different arrays, the bit line and the complementary bit lines are exposed to different noise which cannot be cancelled out. Accordingly, the large inherent levels of noise must be reduced to make the open bit line configuration a more acceptable option.

Figure 2:
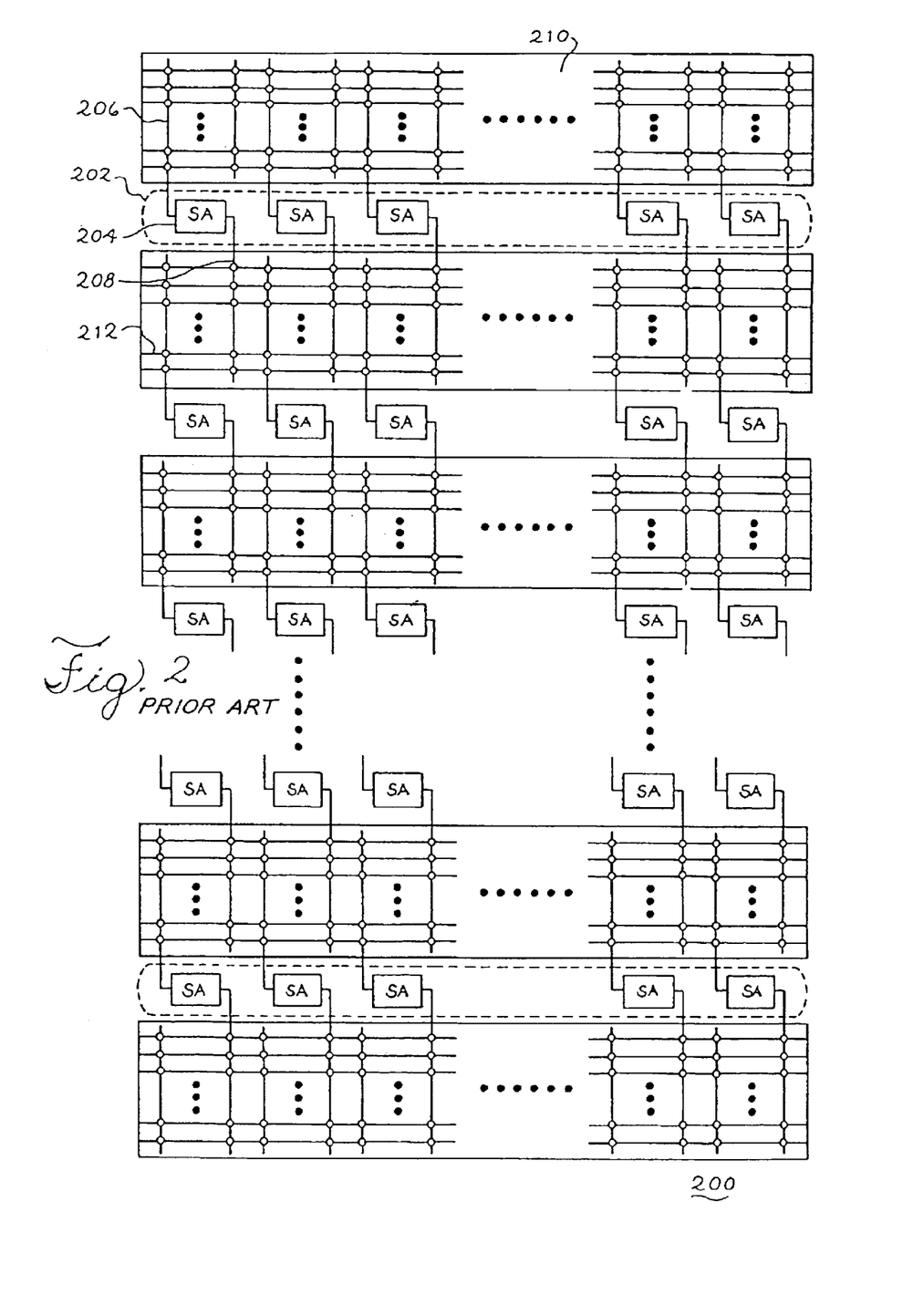
FIG. 2 is a circuit diagram of a portion of a conventional memory cell having a open bit line configuration.
Figure 3:
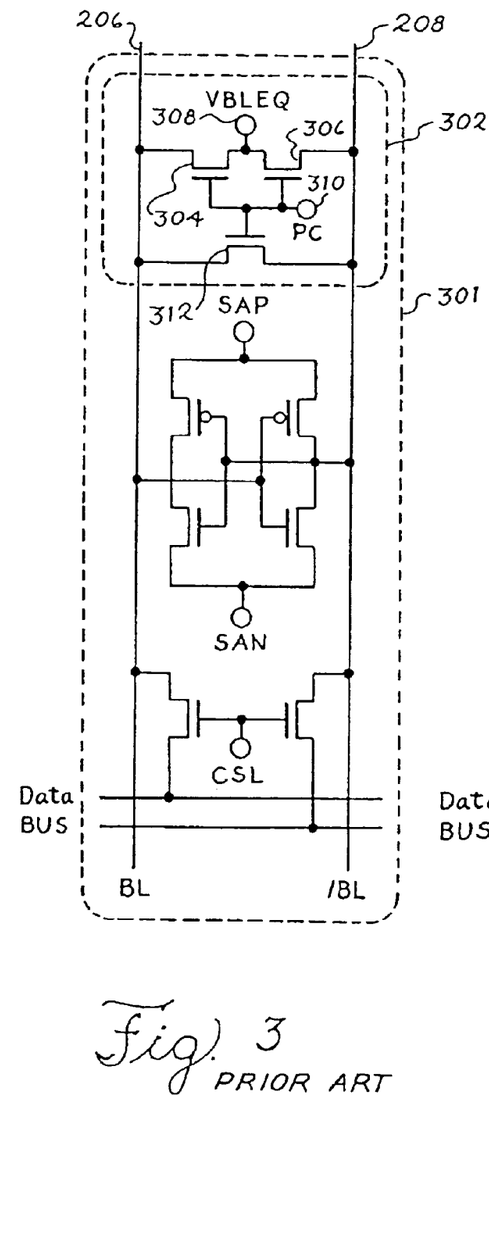
FIG. 3 is a circuit diagram of a conventional bit line sense amplifier.

Referring specifically to FIG. 2, a conventional open bit line configuration is shown. A sense amplifier array 202 including bit line sense amplifier 204, shown in more detail in FIG. 3, is located between two cell array blocks. The conventional sense amplifier 301 comprises an amplifier precharge circuit 302 including a pair of transistors 304 and 306 coupled between the bit lines 206 and 208. A voltage bit line equivalent (VBLEQ) voltage level 308 is coupled to the transistors 304 and 306, while a PC signal 310 is coupled to the gates of the transistors 304 and 306, as well as the gate of a transistor 312. The operation of the sense amplifier of FIG. 3 is well known in the prior art.

Referring back to FIG. 2, one of two bit lines 206 or 208 acts as a reference line during sensing operation. Accordingly, dummy edge cell arrays 210 are necessary to match bit line load for the edge bit line sense amplifier array 202 when reading data from an array of cells 212. This dummy edge cell array generally increases the size of the chip. Another critical problem of open bit line configuration is the large level of noise associated with bit lines located in separate arrays. This decreases the sensing margin, making the sensing operation unstable and cell refresh time poor. In addition to array noise, the inter-bit line coupling noise is large in the conventional open bit line configuration, also reducing the sensing margin. This inter-bit coupling cannot be eliminated.

Accordingly, there is a need for an improved bit line configuration to read data from open bit line cells.

SUMMARY OF THE INVENTION

The present invention relates to a memory cell having a quasi-folded bit line sensing arrangement with an open bit line cell array. The memory cell array noise of various embodiments of the present invention is negligible compared to a conventional memory device having an open bit line configuration. Also, the twisted bit line structure can be employed according to an embodiment of the invention to reduce the inter-bit line coupling noise. The embodiments of the present invention reduce the size of the edge array, reduce the sensing power requirements, and provide a simple bit line layout.

According to one embodiment of the present invention, a memory device comprises a plurality of sense amplifiers, each sense amplifier enabling access to data associated with arrays of cells; a bit line pair being coupled to each sense amplifier and comprising a bit line and a complementary bit line; and a plurality of word lines associated with an array of cells. According to other aspects of the invention, a plurality of switches is employed to enable access to memory cells of the memory device.

The arrangement of the memory device enables a VBLEQ voltage level to be coupled directly to the bit lines and complementary bit lines of the memory device. Finally, an improved sense amplifier having precharge circuit of a single transistor is also described.

According to another aspect of the present invention, a method of bit line configuration to read or write data in a memory device is described. The method comprises providing a bit line pair having a bit line and a complementary bit line, and coupling the bit line pair to a plurality of sense amplifiers. A plurality of switches is also provided in the bit line pair, enabling access to a memory cell to read or write data in the memory cell.

DETAILED DESCRIPTION OF THE DRAWINGS

Figure 4:
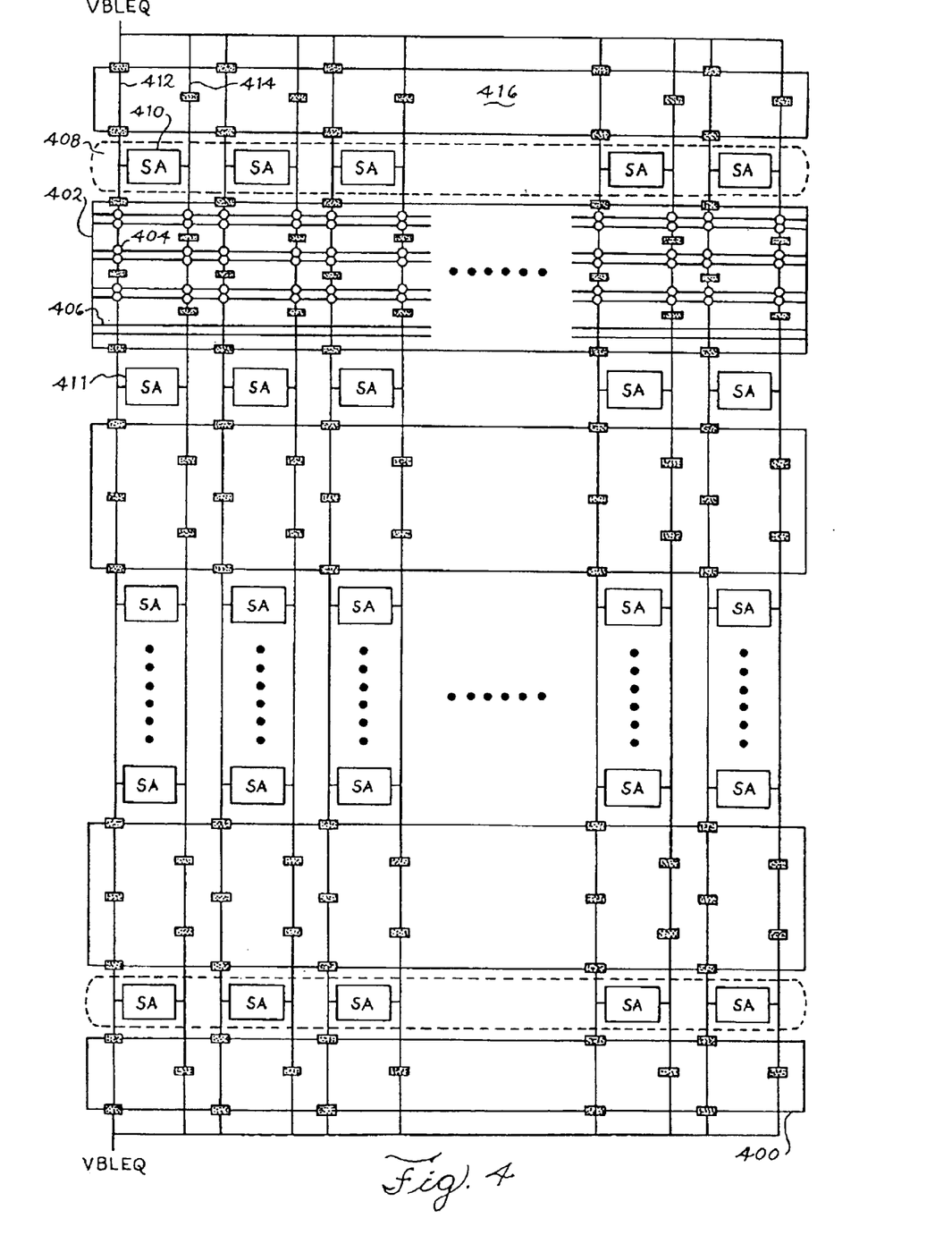
FIG. 4 is a circuit diagram of a portion of a memory cell according to the present invention.
Figure 5:
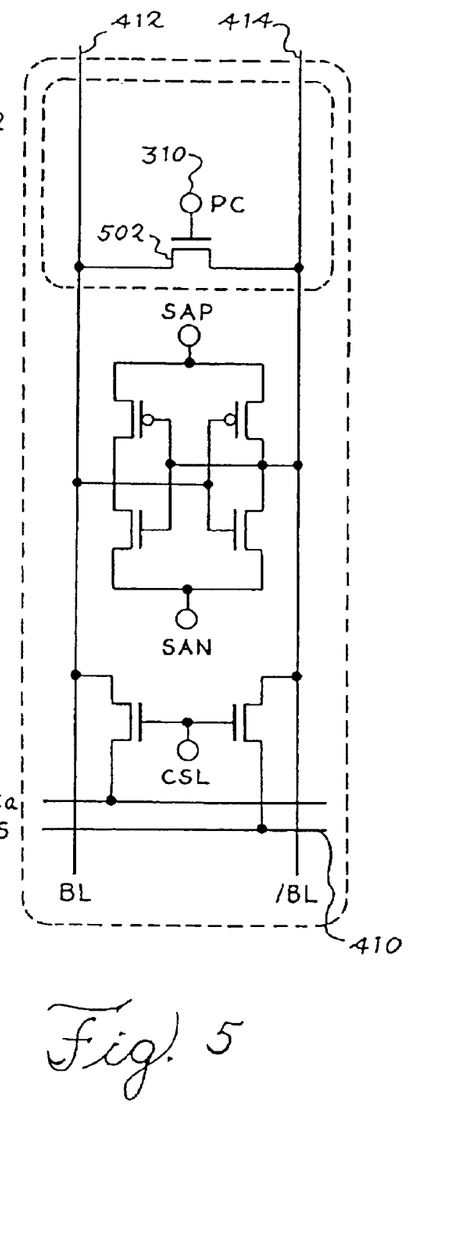
FIG. 5 is a circuit diagram of a bit line sense amplifier employed in FIG. 4 according to the present invention.

The present invention relates to a memory cell having a quasi-folded bit line sensing arrangement with an open bit line cell array. Referring first to FIG. 4, a circuit diagram of a portion of a memory cell according to the present invention is shown. An array 402 comprises a plurality of memory cells 404 coupled to word lines 406. A sense amplifier array 408 having a sense amplifier 410 is coupled to a bit line 412 or a complementary bit line 414. As shown in FIG. 5, a sense amplifier 410 could employ precharge circuit of a single transistor 502 having a gate coupled to the PC signal 310 according to the present invention. Because all bit lines are connected through a plurality of switches, the two transistors 304 and 306 of a conventional sense amplifier of FIG. 3 can be eliminated, and the VBLEQ can be applied to all of the bit lines as shown.

In the conventional open bit configuration, each bit line is not connected to other bit lines in other cell block arrays. The embodiment of FIG. 4 of the present invention connects bit lines through all cell block arrays, and preferably allocates a plurality of switches. The switches are preferably implemented in a zigzag pattern such that two switches are not placed parallel per a pair of bit lines. As will be described in more detail in reference to later figures, a pitch of one switch could be equal to exactly two times bit line pitch. The embodiment of FIG. 4 also requires dummy edge array 416 for load matching of edge sense amplifier array 408. However, the size of the dummy edge array is approximately one half of the other cell array block. That is, if N is the number of segments of one cell array block, the dummy edge array only requires N/2 segments. Accordingly, the memory device of the present invention occupies less area compared to a conventional memory device with open bit line cell array.

Finally, the application of a VBLEQ signal applied directly to the bit and the complementary bit lines according to the present invention. Because the bit lines associated with sense amplifiers in a column are all connected through switches, VBLEQ can be connected to bit line directly on dummy edge, making the bit line precharge time shorter. Unlike conventional sense amplifiers having precharge circuitry which comprises three transistors, the precharge circuitry of the present invention can be simplified to one transistor which is connect to a bit line and its complement bit line or even eliminated according to allowed precharge time. The simplified precharge circuitry of the present invention results in a reduced sense amplifier area.

Figure 6:
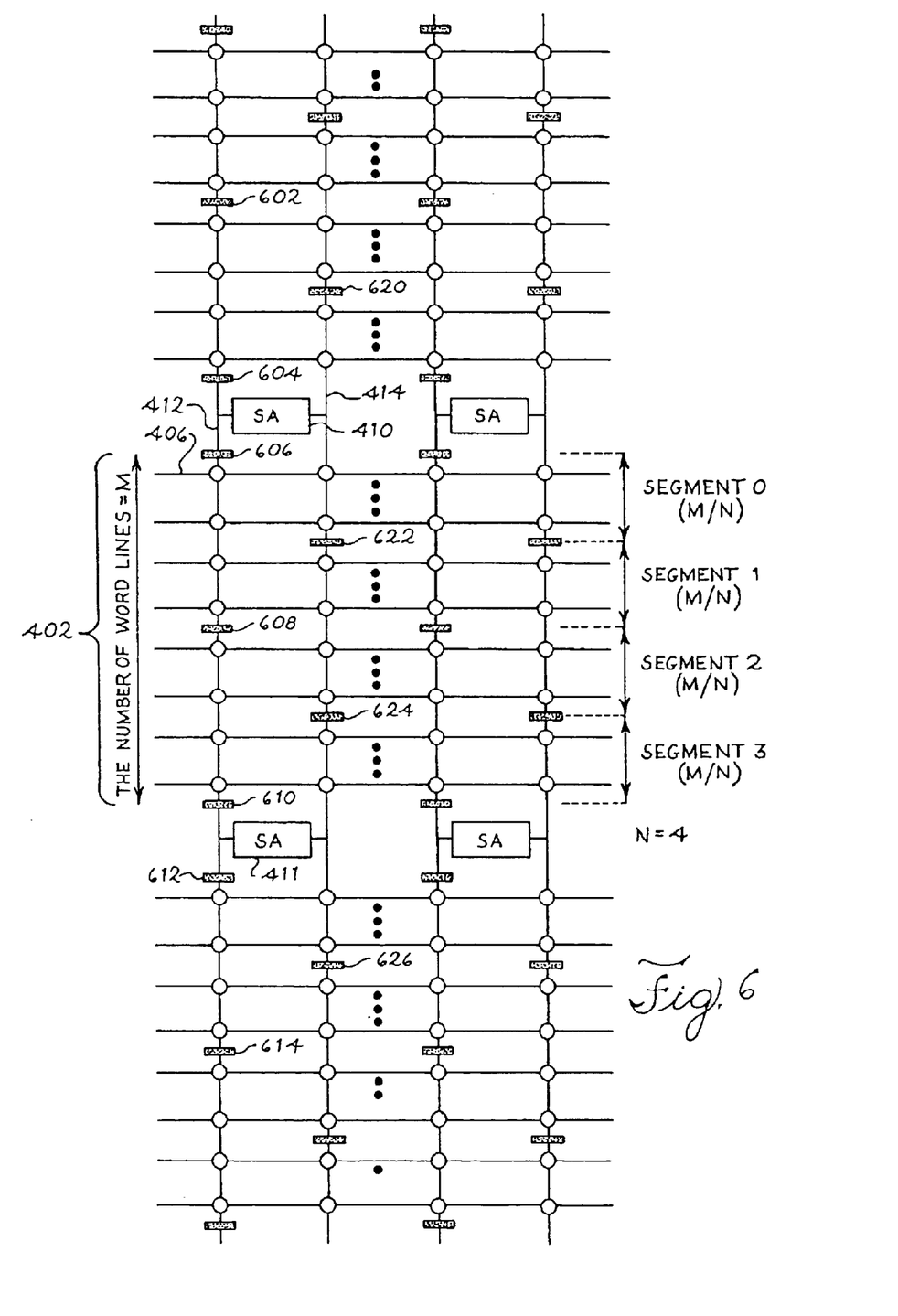
FIG. 6 is an enlarged view of the memory cell of FIG. 4 according to the present invention.

Turning now to FIG. 6, an enlarged view of the memory cell of FIG. 4 according to the present invention is shown. A plurality of switches 602–614, represented by rectangular boxes, is incorporated in a first bit line 412, while switches 620–626 are incorporated in a second bit line 414. The operation of the switches will be described in more detail in reference to FIGS. 7–10, while the layout of the switches in a semiconductor device will be described in more detail in reference to FIG. 13. A full (i.e. dark) rectangular box indicates that the switch is turned on, while an open (i.e. light) rectangular box indicates that the switch is turned off. All bit line segments are connected through switches during precharge. If the number of word line in one cell array block is M, one cell block array is divided by the number of segments N, where N=4 in FIG. 6. Therefore, one segmented cell block has M/N word lines. Although two word lines are shown per segment, more word lines could be employed according to the present invention.

Figure 7:
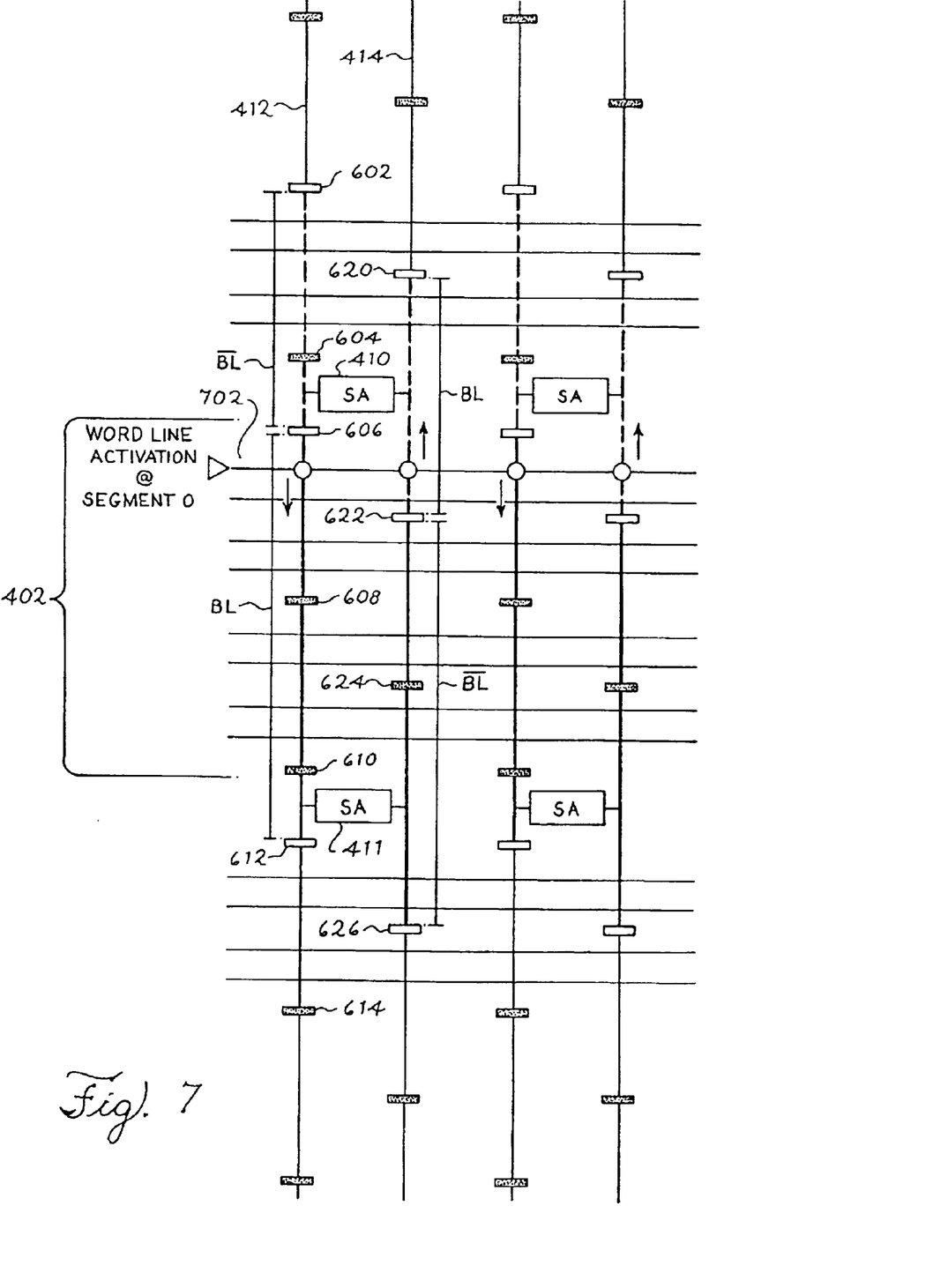
FIG. 7 is an enlarged view of the memory cell of FIG. 4 showing the operation of the cell by enabling a first word line according to the present invention.

Turning now to FIGS. 7–10, the operation of the memory device of the present invention during sensing and writing is described. An enlarged view of the memory cell of FIG. 4 shows the operation of the cell by enabling a first word line according to the present invention. Because there are four segments in the embodiment of FIG. 7–10, there are total of four cases for word line activation. In FIG. 7, one word line 702 is activated in cell array segment 0. The six switches per a bit line pair are turned off, creating two pairs of bit lines which are configured in quasi-folded style. In particular, switches 602, 606, 612, 620, 622, and 626 are turned off, creating a bit line pair (designated BL and /BL) associated with each of the sense amplifiers 410 and 411, enabling sense amplifier 410 to read data from one cell (i.e. the cell associated with bit line 414) and sense amplifier 411 to read data from another cell (i.e. the cell associated with bit line 412).

Figure 8:
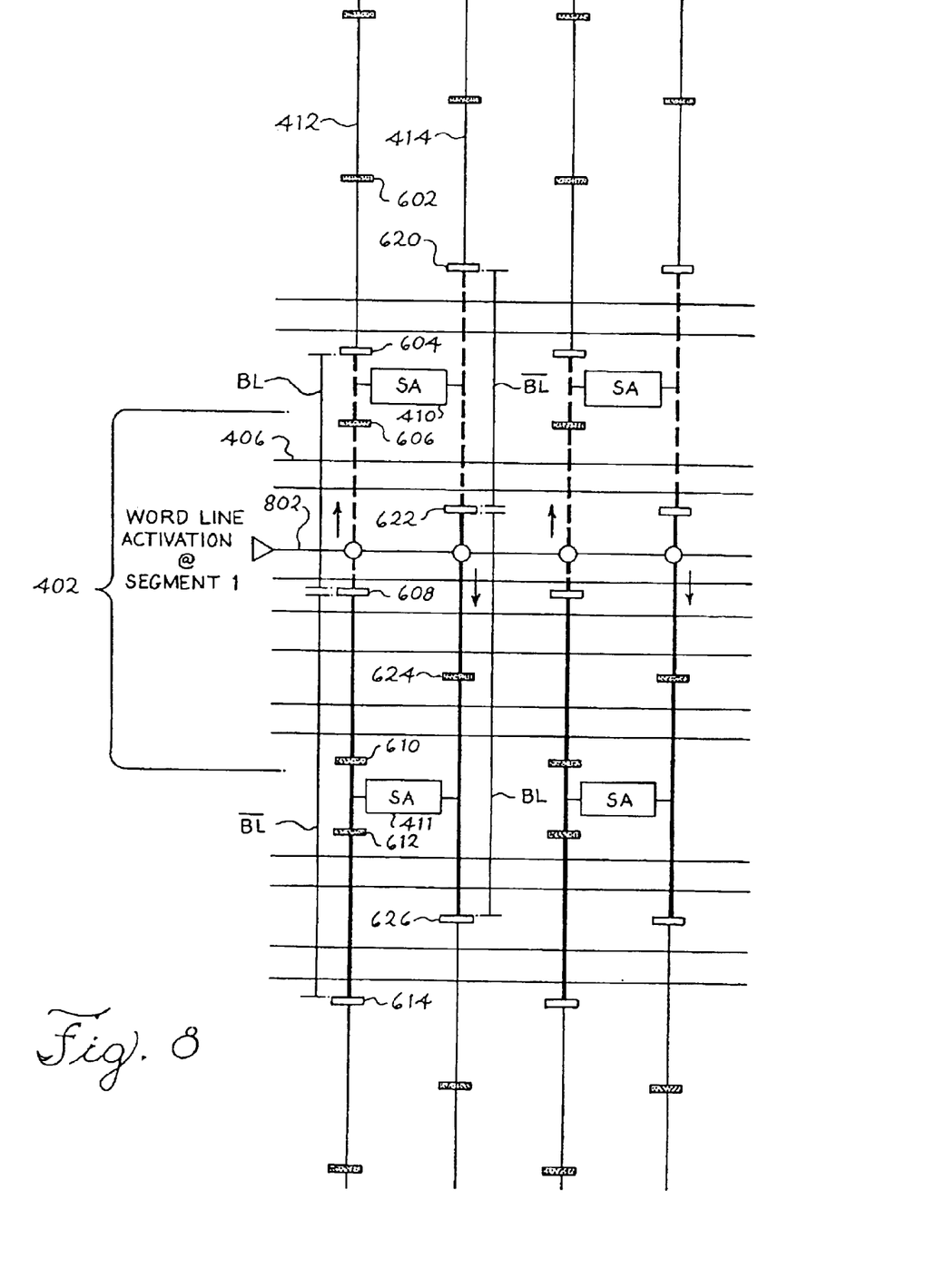
FIG. 8 is an enlarged view of the memory cell of FIG. 4 showing the operation of the cell by enabling a second word line according to the present invention.
Figure 9:
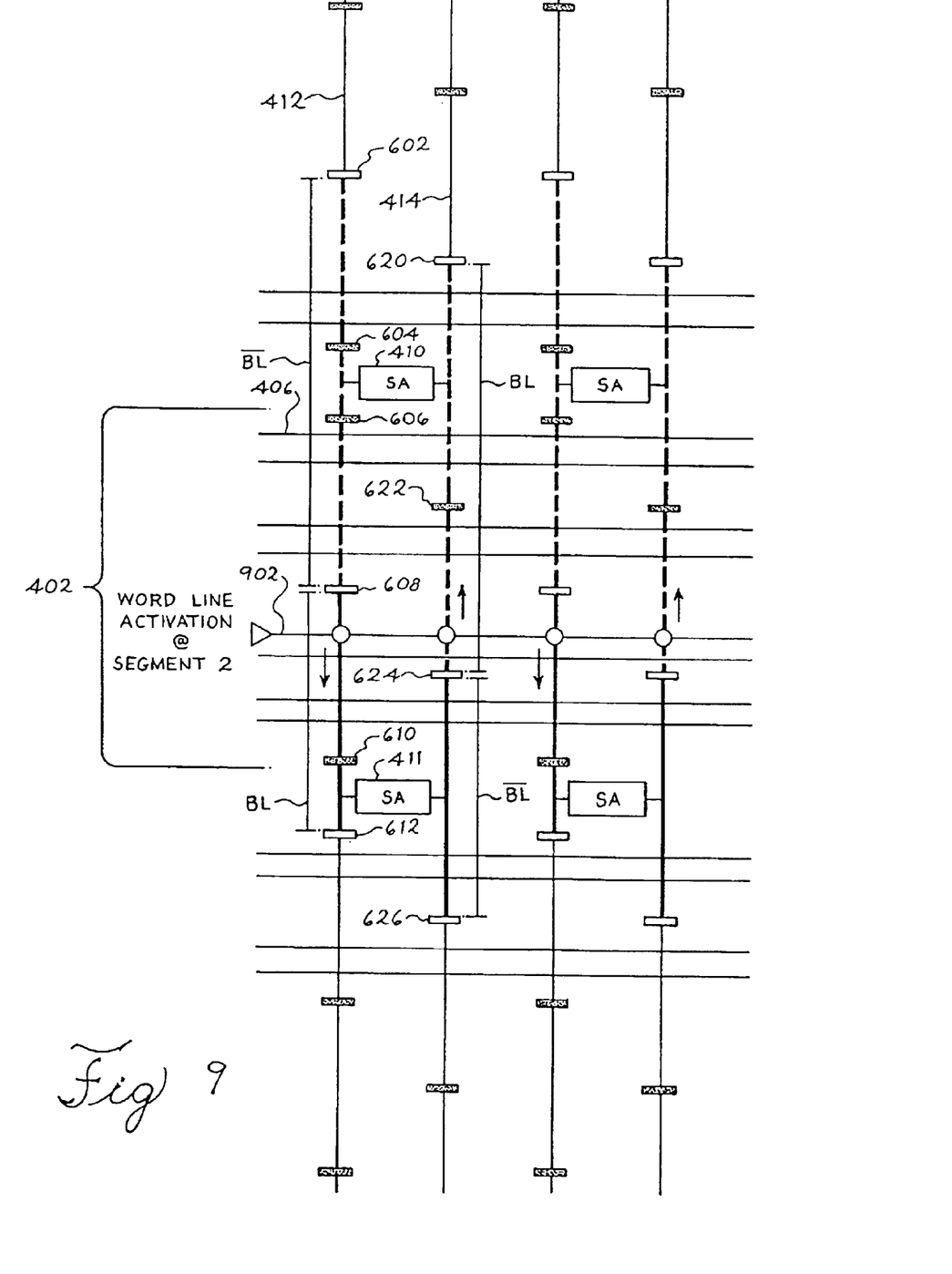
FIG. 9 is an enlarged view of the memory cell of FIG. 4 showing the operation of the cell by enabling a third word line according to the present invention.
Figure 10:
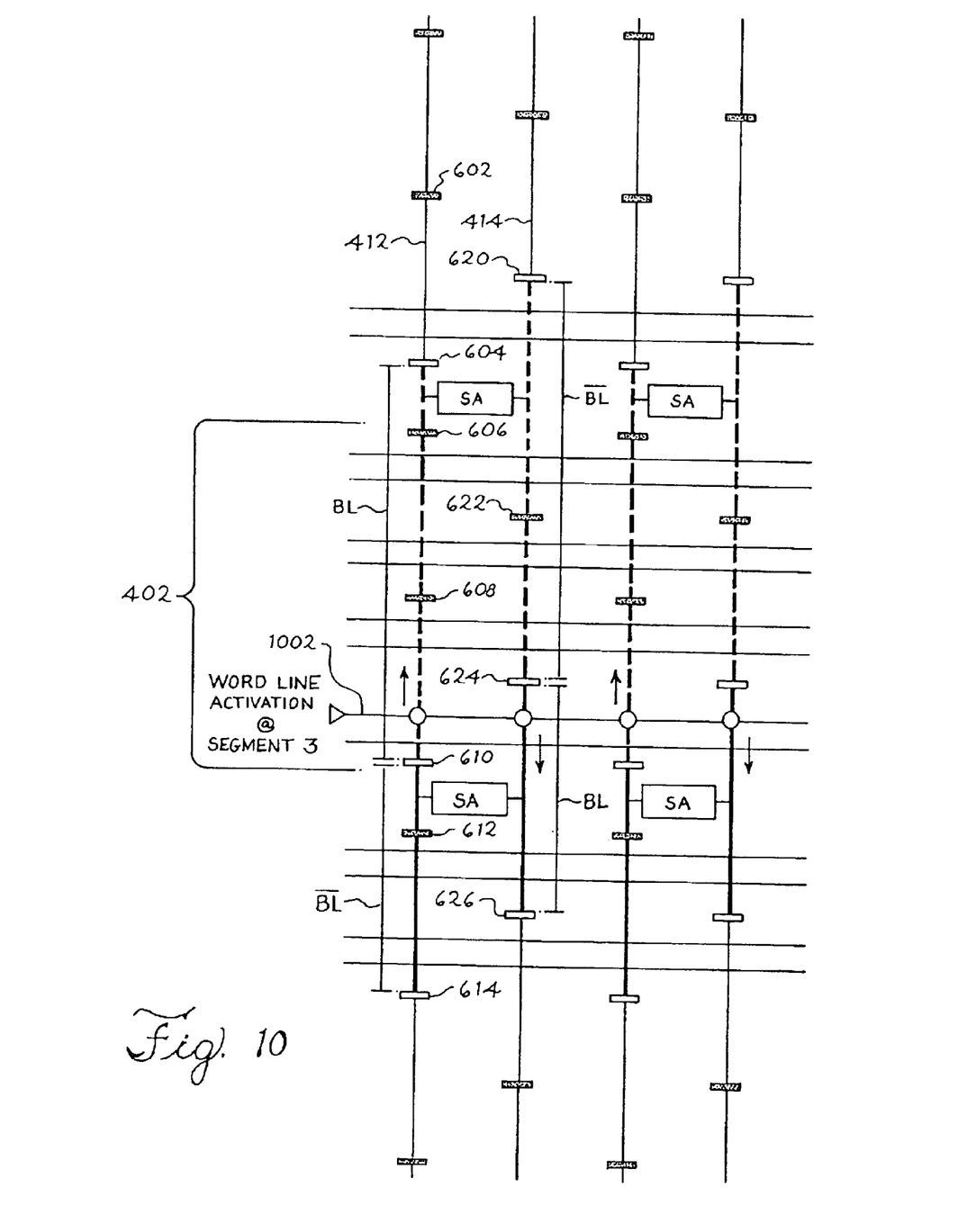
FIG. 10 is an enlarged view of the memory cell of FIG. 4 showing the operation of the cell by enabling a fourth word line according to the present invention.

As shown in FIG. 8, a word line is activated in cell array segment 1. As in FIG. 7, six switches are also turned off for a pair of bit lines. This time, switches 604, 608, 614, 620, 622, and 626 are turned off, enabling sense amplifier 410 to read data from the cell associated with bit line 412 and sense amplifier 411 to read data from the cell associated with bit line 414. As shown in FIG. 9, a word line is activated in cell array segment 2. Switches 602, 608, 612, 620, 624, and 626 are now turned off for a pair of bit lines, enabling sense amplifier 410 to read data from a cell associated with bit line 414 and sense amplifier 411 to read data from a cell associated with bit line 412. Finally, as shown in FIG. 10, a word line is activated in cell array segment 3. Switches 604, 610, 614, 620, 624, and 626 are turned off, enabling sense amplifier 410 to read data from a cell associated with bit line 412 and sense amplifier 411 to read data from a cell associated with bit line 414.

The embodiment of FIGS. 7–10 provides a number of advantages. For example, if the length of bit line on one cell array block is L, one pair of bit lines has length L, and another pair of bit lines has length L/2. As shown in the figure, each bit line sense amplifier is connected to each pair of bit lines which is segmented by switches. Because a quasi-folded bit line configuration is made during sensing, array noise is reduced dramatically compared to the conventional open bit line configuration. Further, one pairs of bit lines has a short length (e.g. L/2). As a result, the sensing power consumption is reduced because of lighter bit line loading. The conventional bit line loading per sense amplifier is 4 CBL, where a CBL equals bit line capacitance which has length L, whereas the memory device of the present invention has 3 CBL loading if N=4. Accordingly, sensing power consumption is reduced by 25%.

Figure 11:
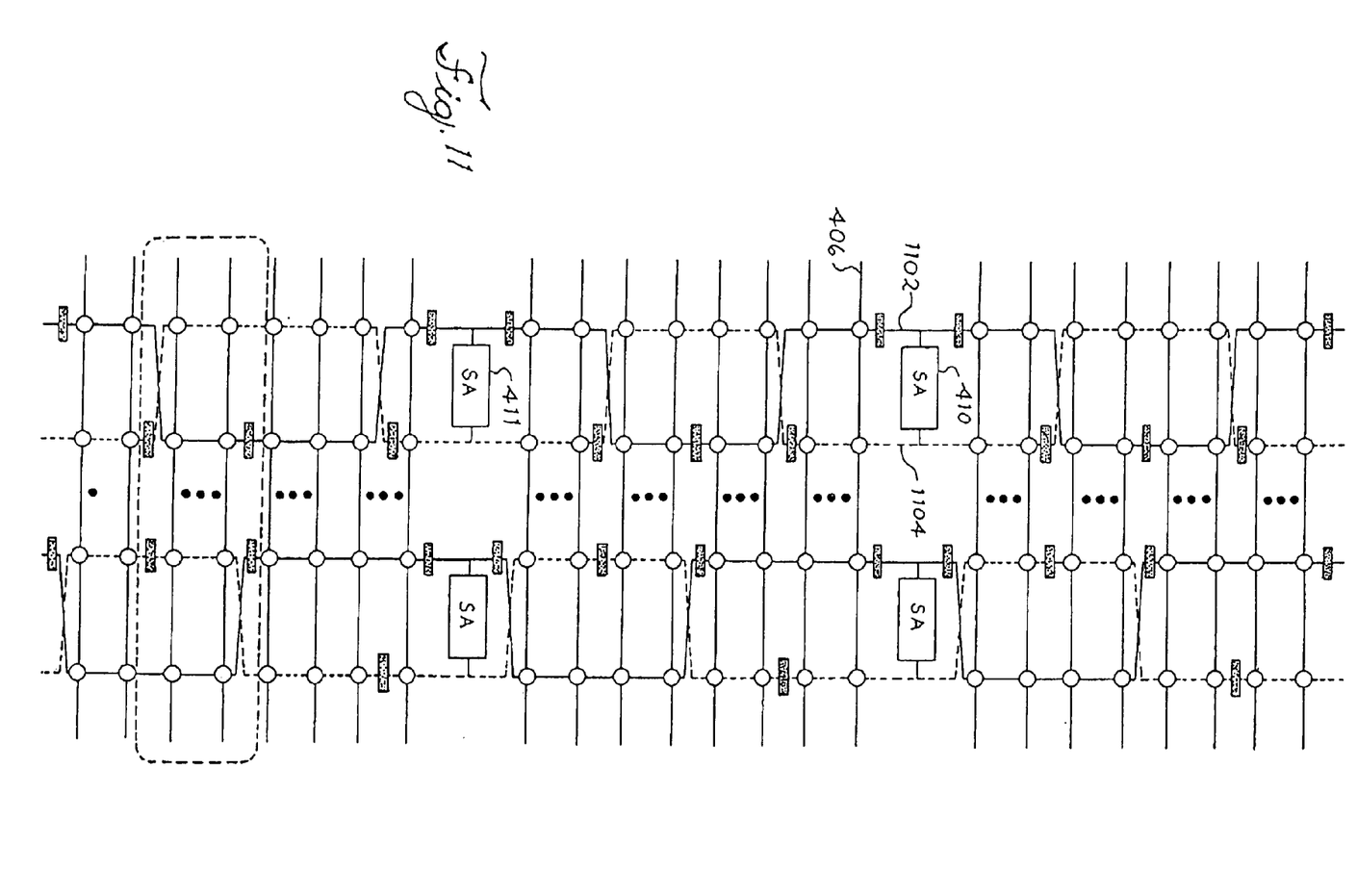
FIG. 11 is a circuit diagram of a portion of a memory cell having a twisted bit line pair configuration according to the present invention.
Figure 12:
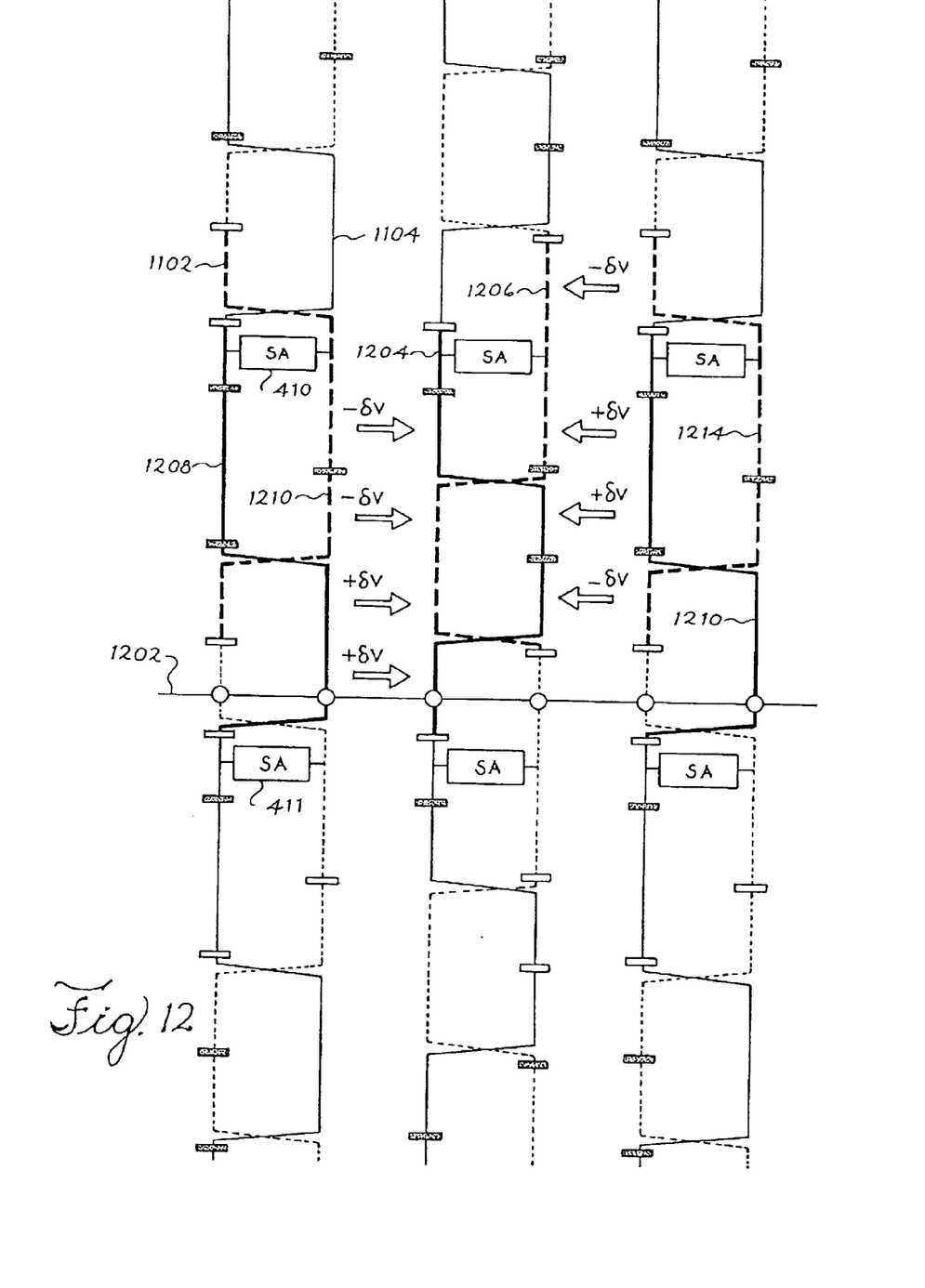
FIG. 12 is a circuit diagram of the memory cell of FIG. 11 showing the reduced inter-bit line coupling noise according to the present invention.

Turning now to FIG. 11, a circuit diagram of a portion of a memory cell having a twisted bit line pair configuration according to the present invention is shown. While memory cells having a conventional open bit line configuration can not cancel off the inter-bit line coupling noise, the embodiment of FIG. 11 employing a twisted bit line configuration reduces the inter-bit noise. The operation of the switches of FIG. 11 is the same as described in reference to FIGS. 7–10. That is, the switches for the respective bit line pairs, although in different physical locations because of the twisted bit line pair configuration, are turned on or off as described above. The inter-bit line coupling noise of the embodiment of FIG. 11 is illustrated in FIG. 12. If the victim bit line (i.e. a bit line receiving interference) is 1204 (or 1206), the aggressor bit line (i.e. the bit line providing inter-bit coupling noise) 1208, 1210, 1214, and 1216 induce some inter-bit line coupling noise to 1204 (or 1206). δV is the voltage level of inter bit line coupling noise from a one quarter bit line segment (that is, L/4 length). As can be seen in FIG. 12, the victim bit line 1204 (or 1206) receives +2δV and −2δV from the aggressor bit lines 1208, 1210, 1214, and 1216 simultaneously. Therefore, all inter-bit line coupling noise to victim bit line 1204 (or 1206) is canceled off.

Figure 13:
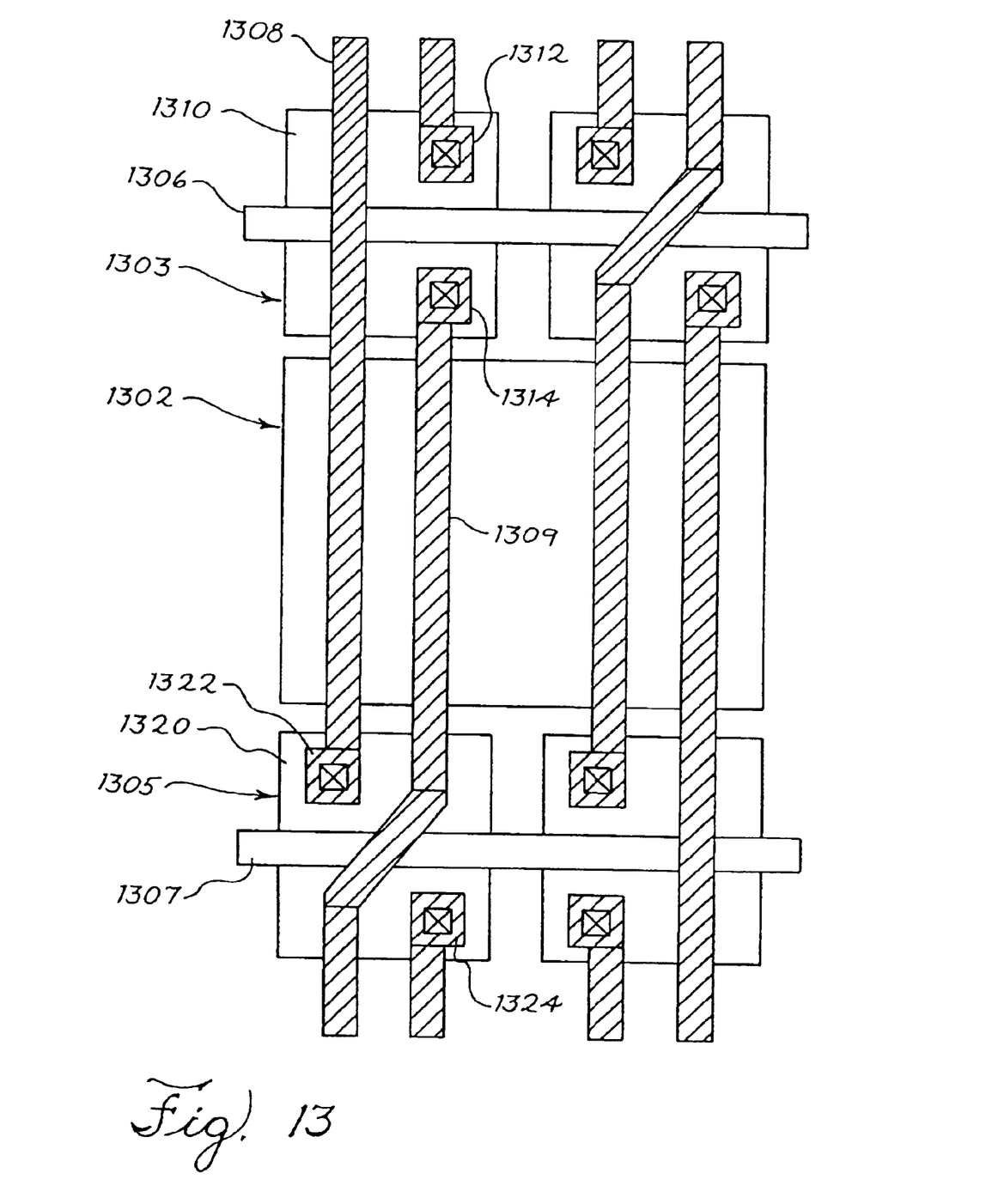
FIG. 13 is a layout showing a switch implemented in a twisted bit line pair configuration according to the present invention.

Finally, FIG. 13 is a further enlarged layout of a portion of a memory cell showing the switches according to the present invention. One important aspect of the present invention is that the twisted bit line can be implemented on switch, thereby eliminating additional area required for twisting. Usually, the twisted bit line implementation requires another metal layer to cross the bit line layer. However, no additional layer is needed in this embodiment of the present invention, reducing the process complexity and cost of the memory device. FIG. 13 shows one example layout for the twisted bit line and switches.

In particular, a cell array segment 1302 having a first switch 1303 and a second switch 1305 is shown. A gate 1306 associated with the first switch 1303 and a gate 1307 associated with the second switch 1305 are shown. Similarly, a first bit line 1308 and a second bit line 1309, each of which are associated with cell array segment, are shown. The switch 1303 comprises the gate 1306, a first active area 1310, and drain and source contacts 1312 and 1314, respectively.

Similarly, the switch 1305 comprises the gate 1307, a second active area 1320, and drain and source contacts 1322 and 1324, respectively. The resulting transistors create switches, as is well know in the art, which can be opened or closed to create the bit line pairs as described above.

It can therefore be appreciated that the new and novel memory cell and method of bit line configuration to read and write data in a memory cell has been described. It will be appreciated by those skilled in the art that, given the teaching herein, numerous alternatives and equivalents will be seen to exist which incorporate the disclosed invention. As a result, the invention is not to be limited by the foregoing embodiments, but only by the following claims.

What is claimed is:

1. A memory device comprising:
a plurality of sense amplifiers, each said sense amplifier enabling access to data associated with arrays of cells;
a bit line pair, said bit line pair being coupled to each said sense amplifier of said plurality of sense amplifiers and comprising a bit line and a complementary bit line;
a plurality of word lines associated with an array of cells, each said word line being selectable;
a plurality of switches positioned in said bit line pair, wherein said switches enables the selection of data from a first memory cell by way of the bit line and the selection of data from a second memory cell by way of the complementary bit line.

2. The memory device of claim 1 wherein an amplifier precharge circuit of each said sense amplifier comprises a single transistor.

3. A memory device comprising:
a plurality of sense amplifiers, each said sense amplifier enabling access to data associated with arrays of cells;
a bit line pair, said bit line pair being coupled to each said sense amplifier and comprising a bit line and a complementary bit line;
a plurality of word lines associated with said arrays of cells, each said word line being selectable; and
a plurality of switches positioned in said bit line pair, said switches connecting all bit lines in a column and enabling the selection of data from a first memory cell by way of said bit line and the selection of data from a second memory cell by way of said complementary bit line.

4. The memory device of claim 3 wherein said precharge circuit of each said sense amplifier comprises a single transistor.

5. The memory device of claim 3 further comprising a VBLEQ signal coupled directly to said bit line pair in a dummy cell array block.

6. The memory device of claim 3 further comprising a plurality of bit line pairs, each bit line pair being associated with a separate plurality of sense amplifiers.

7. The memory device of claim 3 wherein each said first sense amplifier reads data from a cell by accessing said bit line pair and a second sense amplifier reads data from a cell by accessing a second bit line pair.

8. The memory device of claim 7 wherein said first bit line pair and said second bit line pair have different lengths.

9. A memory device comprising:
a plurality of sense amplifiers, each said sense amplifier enabling access to data associated with adjacent arrays;
a twisted bit line pair coupled to each said sense amplifier and comprising a bit line and a complementary bit line;
a plurality of word lines associated with an array of cells, each said word line being selectable; and
a plurality of switches positioned in said bit line pair, said switches enabling the selection of data from a first memory cell by way of said bit line and the selection of data from a second memory cell by way of said complementary bit line.

10. The memory device of claim 9 further comprising a plurality of twisted bit line pairs, each bit line pair being associated with a separate plurality of sense amplifier.

11. The memory device of claim 9 wherein each said sense amplifier reads data from a first cell by accessing a first bit line pair and a second cell by accessing a second bit line pair.

12. The memory device of claim 9 wherein said first bit line pair and said second bit line pair have different lengths.

13. The memory device of claim 9 wherein said memory device comprises a dynamic random access memory.

14. A method of reading and writing data in a memory device, said method comprising the steps of:
providing a bit line pair having a bit line and a complementary bit line;
coupling said bit line pair to a plurality of sense amplifiers;
providing a plurality of switches in said bit line pair, said switches connecting all bit lines in a column and enabling access to data from a first memory cell by way of the bit of line and enabling access to data from a second memory cell by way of the complementary bit line; and
providing access to said cell by selecting said switches.

15. The method of claim 14 further comprising a step of coupling a plurality of bit line pairs to said plurality of sense amplifiers.

16. The method of claim 14 further comprising a step of coupling a VBLEQ signal directly to said bit line pair.

17. The method of claim 14 further comprising a step of arranging said bit line and said complementary bit line in a twisted pair arrangement.

18. The method of claim 14 further comprising a step of staggering said switches for said bit line pair so that said switches for said bit line pair are not adjacent to one another.

19. A method of reading and writing data in a memory device, said method comprising the steps of;

providing a bit line pair having a bit line and a complementary bit line;

arranging said bit line pair in a twisted pair arrangement;

coupling said bit line pair to a plurality of sense amplifiers;

providing a plurality of switches in said bit line pair, said switches connecting all bit lines in a column and enabling access to data from a first memory cell by way of the bit line and enabling access to data from a second memory cell by way of the complementary bit line;

providing access to said memory cells by selecting said switches; and reading data from said memory cells.

20. The method of claim 19 wherein said step of coupling said bit line to a plurality of sense amplifiers comprises a step of coupling said bit line to a plurality of sense amplifiers in a column.

21. The method of claim 19 further comprising a step of coupling a VBLEQ signal directly to said bit line pair.

22. The method of claim 19 further comprising a step of writing data to said memory device.

23. The method of claim 19 further comprising a step of staggering said switches for said bit line pair so that said switches for said bit line pair are not adjacent to one another.

24. A method of reading and writing data in a memory device, said method comprising the steps of:

providing a bit line pair having a bit line and a complementary bit line;

coupling said bit line pair to a plurality of sense amplifiers, each said sense amplifier having precharge circuit comprising a single transistor;

providing a plurality of switches in said bit line pair, said switches associated with said bit line pair being staggered;

enabling access to a memory cell of said memory device;

providing access to said memory cell by selecting said switches; and reading and writing data in said memory cell.

* * * * *